United States Patent [19]
Ozawa

[11] 4,269,900
[45] May 26, 1981

[54] SOLDERLESS CAPILLARY CHIPS

[75] Inventor: Minoru Ozawa, Urawa, Japan

[73] Assignee: Adamant Kogyo Co., Ltd., Tokyo, Japan

[21] Appl. No.: 56,848

[22] Filed: Jul. 12, 1979

[51] Int. Cl.³ .......................... B32B 1/06; A44C 17/00
[52] U.S. Cl. ......................................... 428/542; 63/32; 428/28; 428/134; 428/702
[58] Field of Search .................. 63/32; 428/7, 15, 28, 428/131, 134, 542, 539

[56] References Cited

U.S. PATENT DOCUMENTS

| | | | |
|---|---|---|---|
| 2,087,470 | 7/1937 | Davidson et al. | 63/32 X |
| 2,282,336 | 5/1942 | Meyer | 63/14 |
| 2,353,744 | 7/1944 | Meyer | 63/32 X |
| 4,039,726 | 8/1977 | Carr et al. | 63/32 X |
| 4,081,972 | 4/1978 | Kotlar | 428/28 X |

Primary Examiner—Harold Ansher
Attorney, Agent, or Firm—Burgess, Ryan and Wayne

[57] ABSTRACT

A solderless capillary chip formed of a corundum-system precious stone such as ruby or sapphire, for use in electrical windings and the like. The inner bore of the chip is enlarged adjacent the exit end thereof, to permit relaxation of the wire to be pressure-bonded and thereby provide an improved contact situation for the next pressure-bonding operation.

2 Claims, 6 Drawing Figures

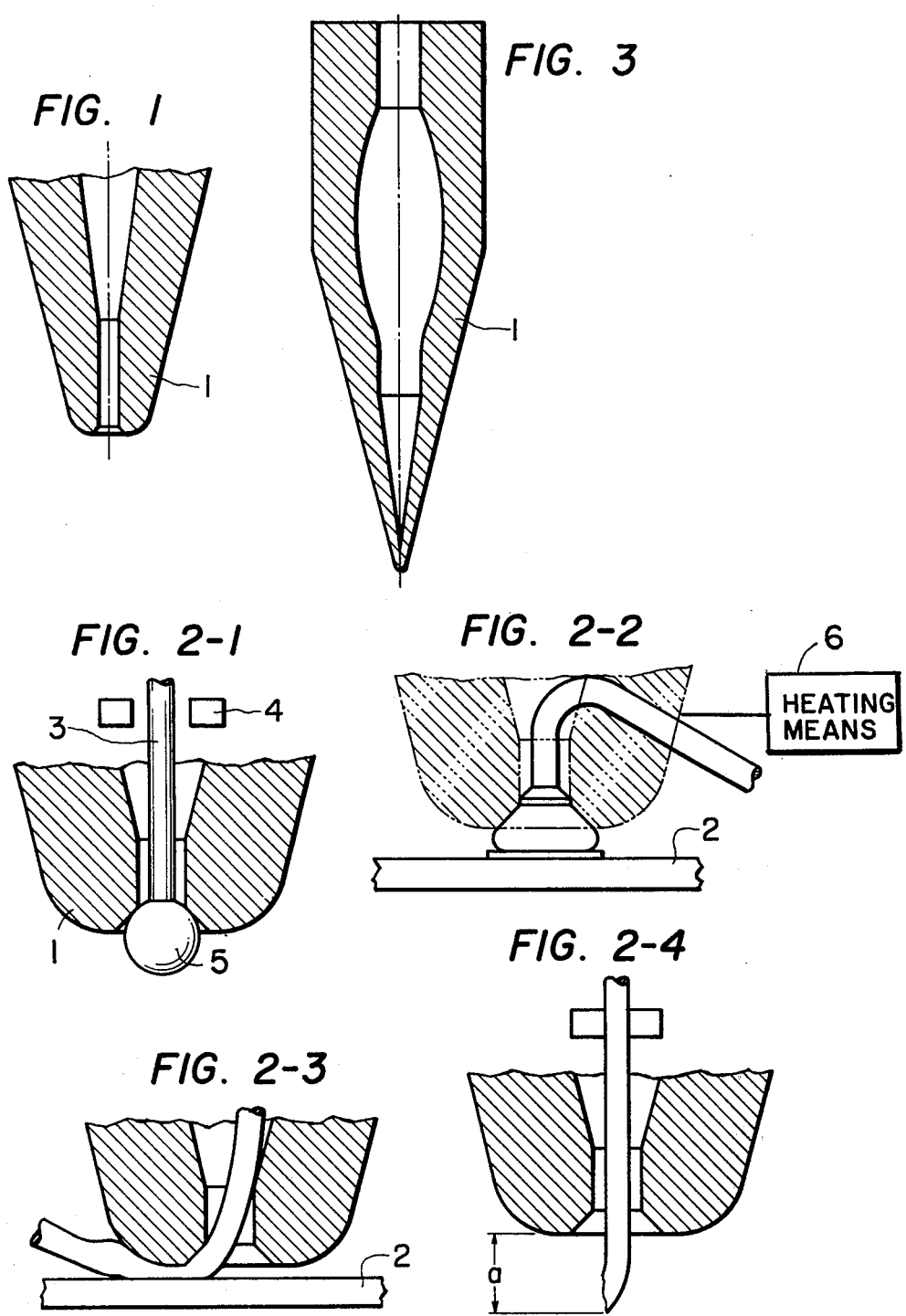

SOLDERLESS CAPILLARY CHIPS

DETAILED DESCRIPTION OF THE INVENTION

The present invention generally relates to a solderless capillary chip formed of a corundum-system precious stone such as ruby and sapphire and designed for use in electric windings and the like. More particularly the invention relates to a solderless capillary chip the inner diameter of which is partially progressively increased to give a suitable relaxation to the wire to be pressure-bonded so that a contact necessary for the next pressure-bonding operation can easily be obtained.

In most cases, the wire used in a conventional capillary chip is formed of a very soft metal, e.g., gold. For this reason, the bore surface of the chip must be as smooth as possible. If the surface has a rough finish, then the bore progressively scrapes off metal each time the wire runs therethrough, leading to sticking of the resulting shavings to the bore surface or clogging of the bore. This often results in rough passage of the wire through the bore, and finally make it necessary to replace the chip. In general, the corundum-system precious stones are finished to a precision several times higher than metals and other ceramic materials. Accordingly, the chip formed of such precious stones serves to reduce the degree of abrasion of the wire to such an extent that no shavings resulting from scraping of the wire stick to the inner surface of the chip. This assures that clogging of the bore and rough passage of the wire are reduced, thus eliminating a fear that the wire may possibly suffer damage or disconnection.

The present invention is characterized in the fact that the capillary chip is designed to have a portion the inner diameter of which is progressively increased so as to permit free bending of a wire passing therethrough, with the result that it remains loose in the chip.

BRIEF DESCRIPTION OF THE DRAWING

FIG. 1 is a sectional view of a general capillary chip;

FIG. 2-1 to FIG. 2-4 are illustrative of the operations of the capillary chip wherein reference (a) denotes the tail of a wire to be pressure-bonded; and FIG. 3 is a sectional view of the capillary chip according to the present invention.

Referring now to the operations of the capillary chip, the tip portion of a capillary chip 1 is heated by heating means 6 to fuse the tip of a wire 3 thereby forming a ball as shown in FIG. 2-1. The thus formed ball is pressure-bonded to a base plate 2 while the wire is drawn to the other portion of the chip, as illustrated in FIG. 2-3. The wire is cut on the outside of the tip portion 5 of the chip 1 as shown in FIG. 2-3, free end of the wire 3 is then pulled up by means of a wire clamp 4. Such operations are repeated. The portion shown at (a) in FIG. 2-4 is a portion which will provide a ball in the next operation. Of course, it is possible to afford more or less relaxation to the wire due to the extension of the wire occurring at the time when it is brought from the state shown in FIG. 2-3 to that shown in FIG. 2-4. In most cases, however, no sufficient pressure-bonding can be effected since the more smooth the inner surface of the chip 1 is, the smaller is the ball obtained.

Thus, the capillary chip the inner surface of which is partially progressively increased according to the present invention permits cutting of the wire while remaining bent and allows the wire to pass into the next step in a state where it is suitably loose. In conclusion, the present invention renders it possible to successively effect a extremely stable pressure-bonding operation at a high speed.

What is claimed is:

1. In combination, a solderless capillary chip formed of a corundum-system precious stone such as a ruby or sapphire, said chip having a straight bore in a tip portion thereof, with a communicating bore having a bulging portion, the inner diameter of which is progressively increased;

means for feeding a wire to be pressure bonded through said bores so that an end of said wire extends from said tip portion;

means for heating said tip portion to cause said wire end to form a ball;

means comprising said tip portion for pressure bonding said ball to a substrate; and means comprising an exterior surface of said tip portion for severing a portion of said wire adjacent the bonded ball from the remainder of said wire.

2. In combination, a solderless capillary chip comprising a hollow precious stone having a polished elongated inner bore extending between (i) a wire-receiving end having a diameter substantially greater than that of a wire to be pressure bonded and (ii) a wire-dispensing and bonding end having a frustonconical exit aperture and an adjacent cylindrical section with a diameter slightly greater than that of said wire, said bore having an enlarged inner portion adjacent and communicating with said cylindrical section, for permitting lateral deflection of the portion of said wire adjacent said exit aperture, means for feeding said wire to be pressure bonded through said bore so that an end of said wire extends from said exit aperture thereof;

means for heating a tip portion of said chip adjacent said exit aperture to cause said wire end to form a ball;

means comprising said tip portion for pressure bonding said ball to a substrate; and means comprising an exterior surface of said tip portion for severing a portion of said wire adjacent the bonded ball from the remainder of said wire.

* * * * *

UNITED STATES PATENT AND TRADEMARK OFFICE
CERTIFICATE OF CORRECTION

PATENT NO. : 4,269,900
DATED : May 26, 1981
INVENTOR(S) : Minoru Ozawa

It is certified that error appears in the above—identified patent and that said Letters Patent is hereby corrected as shown below:

Column 2, line 39: "frustonconical" should be --frustoconical--.

Signed and Sealed this

Fifth Day of January 1982

[SEAL]

Attest:

Attesting Officer

GERALD J. MOSSINGHOFF
Commissioner of Patents and Trademarks